United States Patent [19]

Omori et al.

[11] Patent Number: 5,107,759
[45] Date of Patent: Apr. 28, 1992

[54] SOLDER PASTE STENCIL PRINTER

[76] Inventors: Michael K. Omori, 511 Margie Pl.; Floyd G. Miller, 1678 Rue de Valle, both of San Marcos, Calif. 92069

[21] Appl. No.: 743,979

[22] Filed: Aug. 12, 1991

[51] Int. Cl.$^5$ .............................................. B41F 15/00
[52] U.S. Cl. .................................. 101/114; 101/127.1; 101/126; 101/115; 118/213; 118/406
[58] Field of Search ............... 101/114, 115, 123, 126, 101/127.1; 29/745; 118/213, 406

[56] References Cited

U.S. PATENT DOCUMENTS 894,891  8/1908  Knapp et al. ..................... 118/213
4,054,091 10/1977 Bradley ............................ 101/115

FOREIGN PATENT DOCUMENTS 0012649  1/1982  Japan ................................ 101/126

Primary Examiner—Edgar S. Burr
Assistant Examiner—Christopher A. Bennett

[57] ABSTRACT

A solder paste stencil printing process and apparatus in which a stencil plate having a porous figure printing area may be used for single component solder paste application. The printing operation is performed by alignment of the stencil pattern figure over the appropriate component substrate pads. With the stencil plate being held in place by downward force, solder paste is dispensed over the stencil plate pattern allowing gravity flow of the paste material into the stencil pattern pores. Excess paste material is squeegeed level to the top surface of the stencil plate and the plate lifted from the substrate surface leaving solder paste in the configured pattern. An associated stencil plate holder matched to the apparatus receiver head allows any number of stencil plate patterns to be made available for solder paste application.

3 Claims, 3 Drawing Sheets

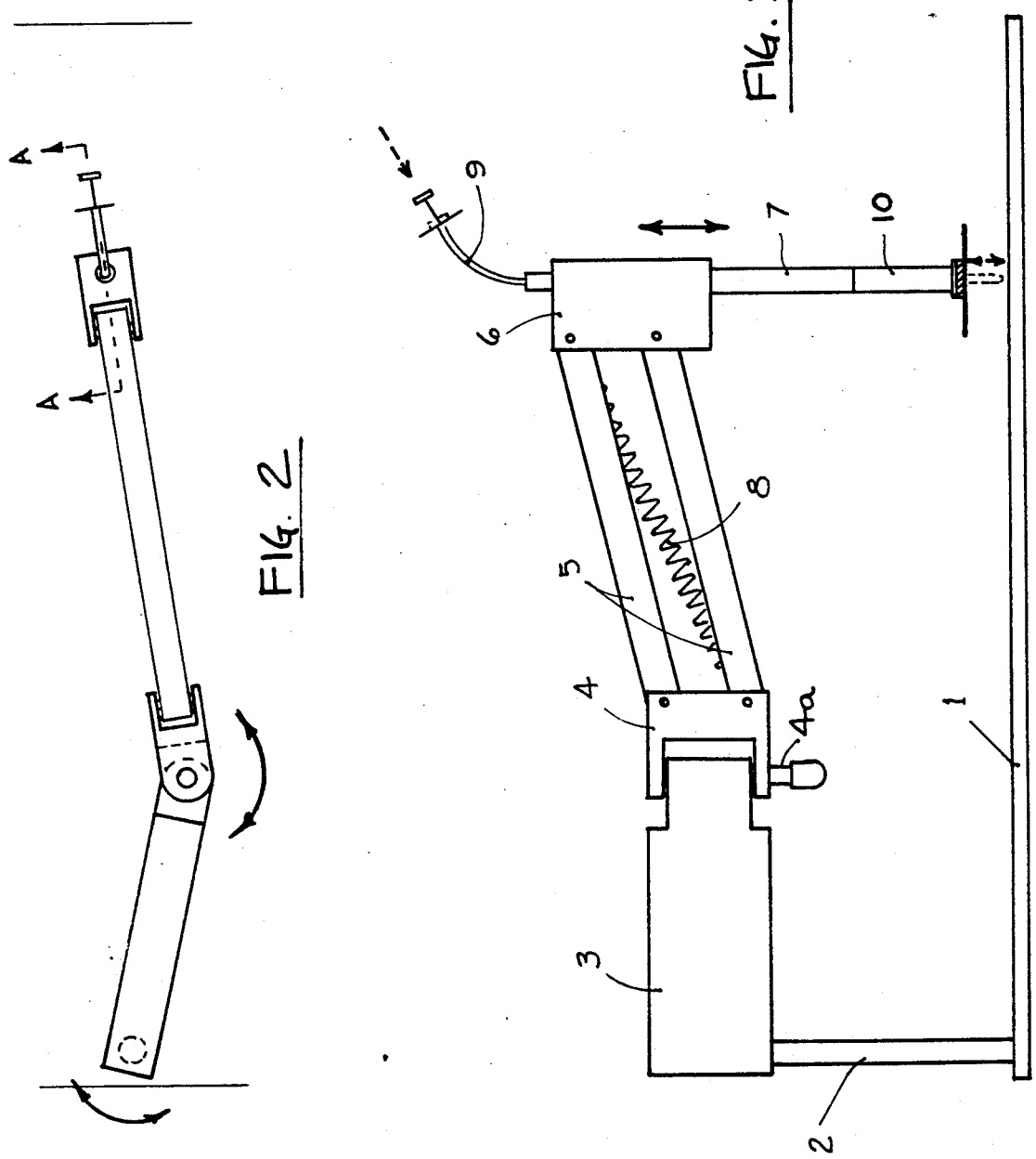

SECTION B-B

SOLDER PASTE STENCIL PRINTER

BRIEF BACKGROUND OF INVENTION

In the conventional process of surface mount technology rework, prototyping, and research and development, exchange or replacement of single components is often encountered. Presently some of the common methods being used to apply solder for placing replacement components onto populated printed circuit boards include:
1. Use of existing solder to mount new component
2. Deposit a solder paste bead onto substrate pads
3. Use of solder tape over substrate pads
4. Surface tension transfer of solder to substrate pads
5. Dispensing of solder dots onto substrate pads Except for solder dot dispensing which requires costly equipment or if done manually is very tedious, the existing methods often exhibit placement inaccuracy, contamination and inconsistent paste volume from pad to pad resulting in problems in bridging and poor solder joints. It is therefore the object of this invention to provide a functionally simple, consistent, repeatable and economical method and apparatus for solder paste application in single component placement processes.

The object and advantages of the present invention will become apparent from the following description and accompanying drawings. The invention relates basically to a simple apparatus that enables available etched stencil plate and solder paste stenciling technology to be used in small and limited work production situations where commercial paste screening or stenciling is not viable.

The apparatus utilizes a stencil mounting head attached to a pivot arm assembly providing easy visual alignment of the stencil plate and substrate pads. This alignment is maintained by downward biased spring force of the stencil head against the substrate surface allowing paste dispensing and squeegee procedures to be completed without disturbing the stencil alignment. The printing procedure is completed by the lifting of the stencil plate from the substrate surface leaving the solder paste precisely applied. Control and isolation of external movement during the critical lifting operation is accomplished by an internal central lifting rod operated by a flexible cable mechanism. Various stencil patterns can be easily interchanged through the use of the associated stencil plate holder that slips onto the mounting head.

DESCRIPTION OF THE DRAWINGS

FIG. 1 shows the elevation of the stencil printer with a stencil holder assembly installed in an operational condition. The dotted portion indicates the plunging action of the lifting rod, with arrows indicating the resulting direction of movement of the stencil head. The stencil is shown raised above the working surface by the action of the lifting rod.

FIG. 2 is a plan view of the arm mechanism. The angular relationship of the mechanism parts was drawn to clarify the pivoting and hinge action of the assembly as indicated by the curved arrows.

DETAILED DESCRIPTION OF THE INVENTION

Refering to FIG. 1, the subject printed circuit assembly to be worked upon is placed conveniently on the work plate 1. It is only required that the area to be stencilled be within the physical working distance of the printer head 6 pivoting about the pivot post 2. The subject area thusly located, a stencil holder 10 with the desired stencil pad footprint pattern is selected.

Figure 4:
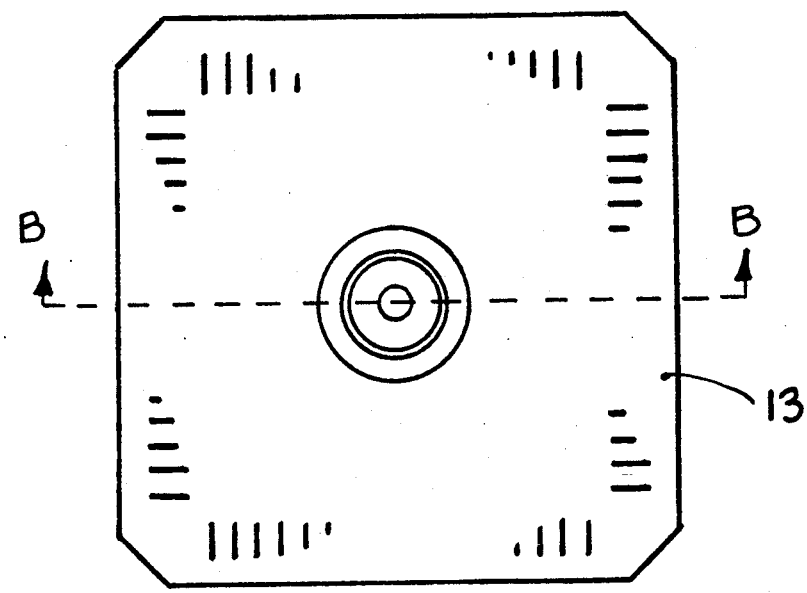
FIG. 4 is a plan view of the stencil holder and a stencil plate. The actual component footprint pattern is not significant to the invention and is not drawn in detail.
Figure 5:
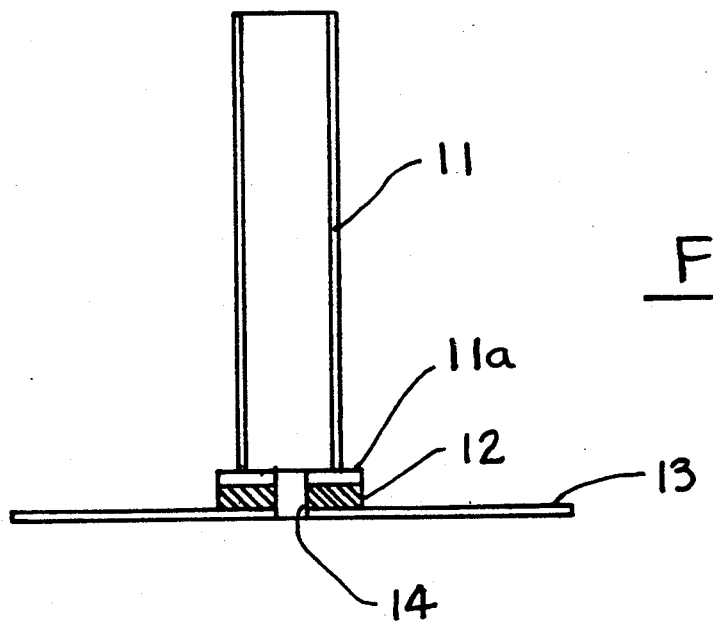
FIG. 5 is the cross section B—B, FIG. 4, showing a stencil plate bonded to the stencil holder.

The stencil holder assembly FIGS. 4 and 5 consists of a shaft 11 whose inside diameter allows it to be slipped over the stencil head shaft 7. A step washer 11a is attached to the shaft 11 to provide a support and bonding surface for a dense foam type resilient conforming pad 12. The specific function of the conforming pad 12 is to accommodate any small irregularities or angular variations between the stencil holder 11,11a, stencil plate 13 and substrate surface. The exact composition of the conforming pad 12 is incidental to its design function. The stencil plate 13 is bonded with adhesive to the conforming pad 12, thus completing a stencil holder assembly 11,11a,12,13. The stencil plate material and surface mount technology pad footprint specifications are publically available and therefore not further described. The centrally located aperture 14 in the stencil plate 13, as well as in the conforming pad 12 and step washer 11a is a key design element allowing thru passage of the lifting rod 7a, FIG. 3.

The stencil holder assembly 10 is slipped over the printer head shaft 7 and is held under light friction from the ball clip 7b. With the stencil holder 10 in place, manual horizontal plane alignment of the stencil over the substrate pads is provided by rotation of the pivot arm 3 about the vertical pivot post 2 and rotation of the parallel arms system 4,5 about the hinge pin 4a. Rotation of the stencil holder 10 about the printer head shaft 7 axis allows exact alignment of the stencil apertures over the substrate pads. The tension spring 8 integrated in the parallel arm system provides downward force at the printer head 6, along the printer shaft 7, along the stencil holder 10 and resulting in the stencil plate 13 being held firmly against the substrate surface.

With the stencil 13 now aligned and held in place, solder paste is applied over the stencil apertures and squeegeed to the level of the stencil surface. The methods for paste dispensing and squeegeeing vary and are of individual preference and therefore not further described. The controlled lifting of the stencil holder assembly 10 from the substrate is accomplished by depressing cable release 9.

Figure 3:
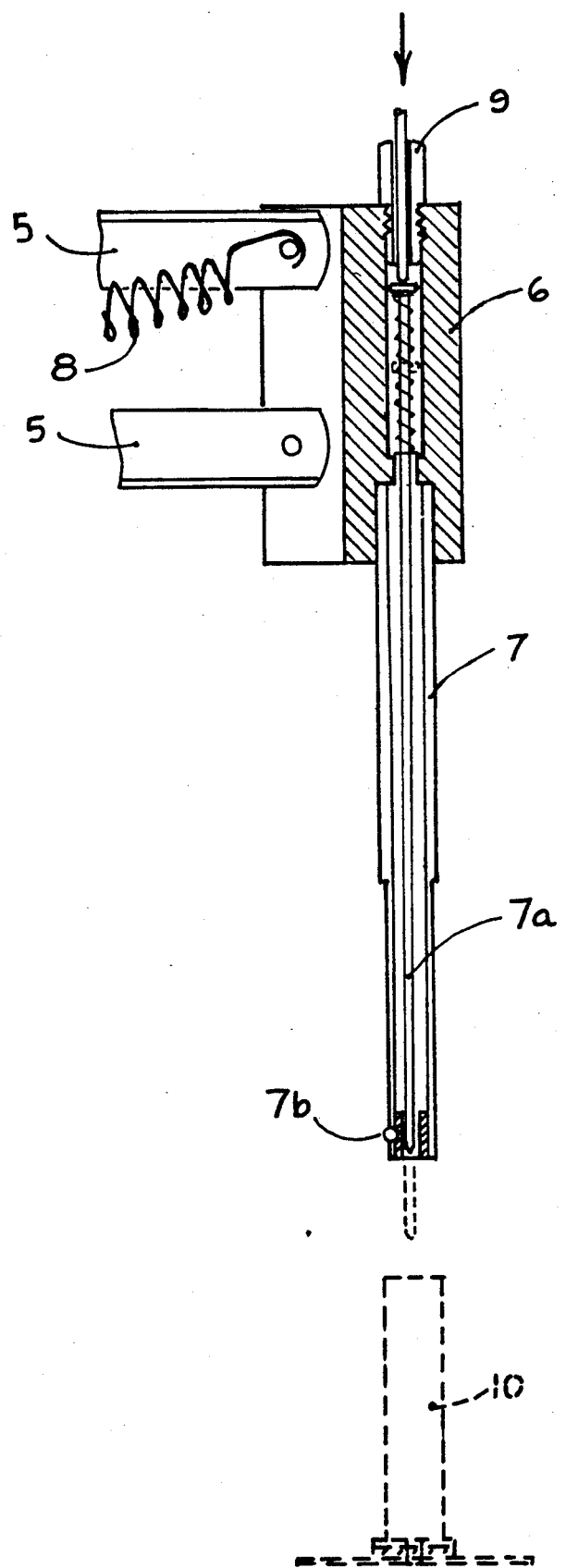
FIG. 3 shows the detailed cross section A—A, FIG. 2, of the printer head with the internal lifting rod mechanism. In dotted outline aligned with the printer head shaft is a stencil holder assembly, drawn to clarify the relationship and attachment of the stencil holder assembly to the stencil printer.

Refering to FIGS. 1 & 3, when the cable release unit 9 is depressed, the lifting rod 7a located and centrally guided in the printer head 6 and shaft 7 is forced downward to the position shown in dashed outline. The activated lifting rod 7a passes through the aperture 14, FIG. 5 in the stencil holder assembly 10. The tip of the lifting rod 7a contacts the substrate surface and, unable to continue downward, forces the entire printer head assembly 6,7 and attached stencil holder assembly 10 upward and clear of the substrate surface. The results of the described action is the application of solder paste to single component substrate pads that is accurately located and of consistent quantity and shape.

Although the invention is described in relation to preferred embodiments, it will be apparent to those skilled in the industry that many variations, alterations and modifications can be made in the practices of the present invention without departing from the scope and spirit thereof as set forth in the preceeding description and in the following claims.

SUMMARY OF INVENTION

In accordance with this invention, an apparatus is provided for stencil printing solder paste for single component footprint patterns onto populated printed circuit assemblies.

What is claimed is:

1. A solder paste stencil printer comprising;
   a working base plate;
   a pivot post;
   a pivot arm mounted on said pivot post for horizontal plane motion;
   a parallel arm system;
   a hinge piece connecting said parallel arm system to said pivot arm;
   said parallel arm system being downwardly spring biased for vertical plane motion;
   and a printing head consisting of;
   a main body, a mounting shaft, a stencil holder, a friction ball clip for securing said stencil holder to said mounting shaft, a lifting rod passing through said main body and said mounting shaft, and a cable plunger mechanism for operating said lifting rod.

2. A solder paste stencil printer according to claim 1 further comprising:
   a stencil plate mounted on said stencil holder;
   said stencil holder comprising;
   a shaft for fitting over said mounting shaft of said printing head, a step washer having a center aperture for passage of said lifting rod, and a resilient conforming pad having a center aperture for passage of said lifting rod.

3. A solder paste stencil printer according to claim 2 wherein said stencil plate comprises:
   a plurality of apertures conforming to a footprint pattern;
   and a centrally located aperture within said plurality of apertures for passage of said lifting rod.

* * * * *